Dec. 1, 1953

R. L. HARVEY 2,661,399

VARIABLE BAND WIDTH AMPLIFIER

Filed July 27, 1949

INVENTOR
Robert L. Harvey
BY H. D. Newton
ATTORNEY

Patented Dec. 1, 1953

2,661,399

UNITED STATES PATENT OFFICE 2,661,399

VARIABLE BAND WIDTH AMPLIFIER

Robert L. Harvey, Princeton, N. J., assignor to Radio Corporation of America, a corporation of Delaware Application July 27, 1949, Serial No. 107,108

1 Claim. (Cl. 179—171)

Figure 1:
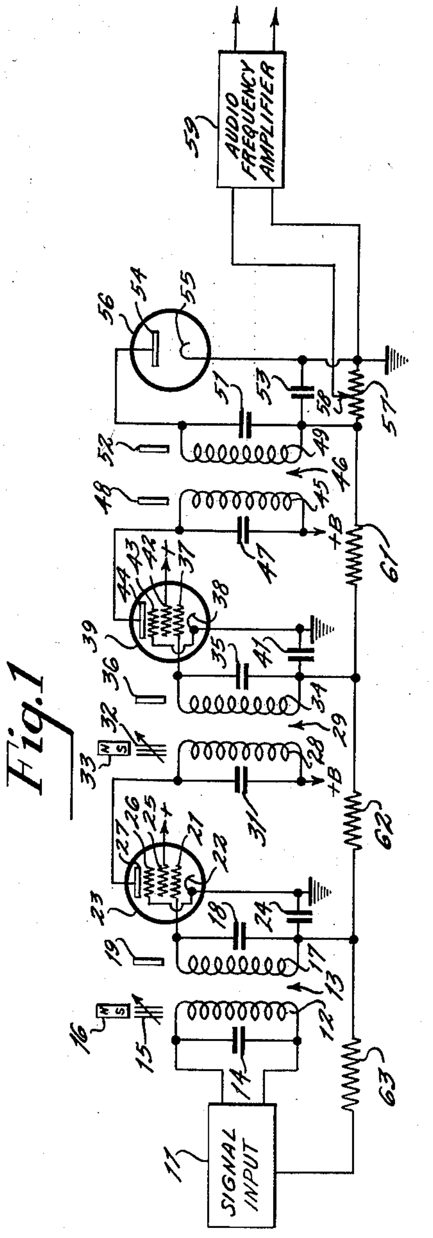

This invention relates to signal amplifying systems and particularly to frequency selective signal amplifiers having automatically variable band widths.

In most present day radio receivers, it is customary to amplify the signal-modulated carrier waves before these waves are finally demodulated to recover the intelligence signals therefrom. To effect this type of signal amplification, it is necessary, in order to achieve maximum amplifying efficiency, to employ an amplifying system in which are incorporated frequency selective facilities. In this manner, only a predetermined band of signal frequencies is amplified. The band width of such amplifiers determines the fidelity with which the signals are amplified and also the interference which may be encountered from signals in adjacent channels. When the received signals which are to be amplified are relatively weak, it is necessary to adjust the receiver to maximum sensitivity. Also, in order to avoid interference from stronger signals in adjacent channels it is necessary to make the band width of the signal amplifiers relatively narrow. On the other hand, when the received signals are strong, less sensitivity of the receiver is required. Furthermore, in order to realize the maximum fidelity of reproduction of such signals, it is desirable that the band width of the amplifier be relatively broad. It is seen, therefore, that it is highly desirable to provide an amplifier for signal-modulated carrier waves which has a variable band width in order to most effectively amplify not only relatively weak signals but also relatively strong signals.

A number of prior art radio receivers have been provided with variable band width amplifiers. However, many of such amplifiers have been quite complicated and, therefore, relatively costly. Furthermore, these prior art signal amplifiers have been subject to the disadvantage that, in varying the band widths thereof, there also has been produced an undesired shifting of the center frequency of the band to which they are tuned. The shifting of the center frequency causes signal distortion as a result of which the sounds are not reproduced with fidelity.

It, therefore, is an object of the present invention to provide an improved variable band width signal amplifying system which is relatively simple in construction and accordingly of relatively low cost and in which the center frequency of the band to which it is tuned does not shift as the band width is varied.

Another object of the invention is to provide an improved coupling transformer for use in a signal-modulated carrier wave amplifying system in which the resonant frequencies of the primary and secondary windings shift oppositely in frequency in response to variations of the signal intensity and in substantially equal magnitude so as to maintain a relatively constant center frequency.

A further object of the invention is to provide a novel coupling transformer for use in a variable band width signal amplifying system wherein the primary winding is coupled to the output circuit of one signal conveying stage and the secondary winding is coupled to the input circuit of a succeeding signal amplifying stage so that the respective resonant frequencies may be equally and oppositely shifted under the control of an automatic volume controlling voltage which varies in magnitude in accordance with variations in the level of the signal-modulated carrier waves which it is desired to amplify.

In accordance with the present invention, there is provided, for example in a radio receiver, a source of signal-modulated carrier waves and a variable band width amplifier which includes an electronic signal amplifying stage which, for example, may comprise an electronic tube having a cathode, an anode and a control grid and also a coupling transformer for use therewith. The primary winding of the transformer is coupled to the signal source and the secondary winding is coupled to the grid-to-cathode circuit of the amplifying tube. Both of these windings are nominally tuned to the center frequency of the band of signal frequencies to be amplified. The primary winding is provided with a core having a permeability which is subject to variation as a result of a variation of the magnitude of the magnetizing force therefor. The secondary winding is provided with a core which has a substantially constant permeability irrespective of the magnitude of the magnetizing force therefor. The effective magnetizing force for the primary core is derived from the signal currents which traverse the primary winding. Consequently, this magnetizing force is variable, thereby effecting a variation of the core permeability. Depending upon the particular characteristics of the core used with the primary winding, an additional magnetic means may, if necessary, be mounted adjacent to the core for producing flux of suitable fixed magnitude and polarity relative to the polarity of the flux produced by the winding to bias the core so that the permeability thereof varies inversely to the winding-produced flux.

The receiver also includes a signal demodulating means which is coupled to the anode of the amplifying tube in order to develop a gain controlling voltage which varies in magnitude in accordance with variations in the level of the carrier waves. The demodulating means is coupled by suitable circuit means to the signal source and also to the grid-to-cathode circuit of the signal amplifying tube. By such means the signal currents traversing the primary and secondary windings of the coupling transformer are varied inversely to variations in the level of the carrier waves so as to shift the resonant frequencies of the primary and secondary windings substantially equally and oppositely, whereby to vary the effective band width of the amplifier in accordance with the intensity of the signal-modulated carrier waves without concomitantly shifting the center frequency of the amplifying system.

In accordance with a further feature of the present invention, the resonant frequencies of the primary and secondary coupling transformer windings are shifted substantially equally and oppositely by taking advantage of the change of the effective inductance of the primary winding caused by a change of the permeability of its core, and at the same time the resonant frequency of the secondary winding is changed by reason of the capacitance change which is effected in the grid-to-cathode circuit of the amplifying tube as a result of the gain controlling voltage impressed thereon.

In accordance with the still further feature of this invention, the signal amplifying system may comprise a plurality of stages, some of which may embody automatically variable band width facilities and at least one of which, preferably one following the variable band width stages, has a relatively broad, substantially constant frequency response.

The novel features that are considered characteristic of this invention are set forth with particularity in the appended claim. The invention itself, however, both as to its organization and method of operation, as well as additional objects and advantages thereof, will best be understood from the following description taken in connection with the accompanying drawing.

Figure 2:
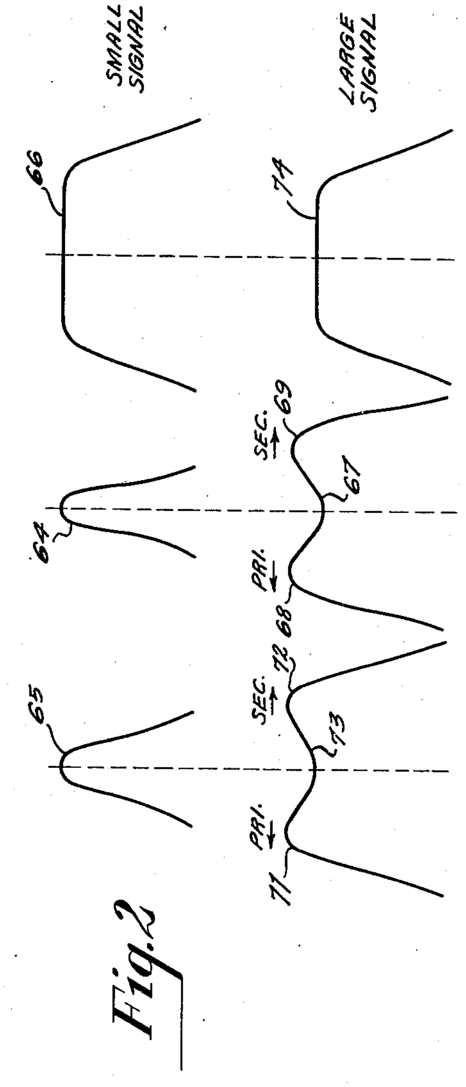

In the drawing:

Figure 1 is a circuit diagram of that portion of a superheterodyne radio receiver embodying the present invention; and, Figure 2 is a series of curves representing the frequency response characteristics of the several signal amplifying stages under various conditions.

Having reference now to Figure 1 of the drawing, there is shown signal input means 11 from which is derived a signal-modulated carrier wave. The particular character of the signal input means employed in conjunction with the present invention is immaterial. For example, it may be the output circuit of a frequency converter stage of a superheterodyne radio receiver. Alternatively, it may be the pickup device of a phonograph or a film sound record where the signals are modulated on a carrier wave. On the other hand, it may be the receiving apparatus coupled to a wired signal conveying carrier system. In any case it should be provided with gain controlling facilities. The output circuit of the signal input means 11 is coupled to the primary winding 12 of an intermediate frequency coupling transformer 13. The primary winding 12 is resonated at the desired center frequency of the band of frequencies to be amplified by means of a capacitor 14 connected in shunt therewith. The primary winding 12 also is provided with a core 15 having a permeability which is subject to variation as a result of variations of the magnetizing force therefor. Preferably, such a core is formed of a ferrite material. In this instance, it will be assumed that the core 15 has a permeability which varies directly with the magnetizing force to which it is subjected. Accordingly, there also is provided a magnetic means such as a permanent magnet 16 mounted adjacent to the core 15 so as to provide, as part of the core magnetizing force, a substantially constant flux. The secondary winding 17 of the coupling transformer 13 is resonated at the center frequency of the band of carrier wave frequencies to be amplified by means of a shunt-connected capacitor 18. The secondary winding is provided with a core 19 which has a substantially constant permeability.

The secondary winding is coupled to the control grid 21 and cathode 22 of a first stage signal amplifying electronic tube 23 by means of a capacitor 24. The screen grid 25 of the tube 23 is connected to a suitable source of positive potential as indicated and the suppressor grid 26 of this tube is conventionally connected to the grounded cathode 22.

The anode 27 of the tube 23 is coupled to the primary winding 28 of a second interstage coupling transformer 29 and to a suitable source of space current as indicated at +B. As in the case of the transformer 13 the primary winding 28 of the transformer 29 also is resonated at the center frequency of the carrier wave frequency band by means of a shunt-connected capacitor 31. The primary winding also is provided with a variable permeability core 32 which may be similar to the core 15 and, in proximity thereto, a magnetic means such as a permanent magnet 33. The secondary winding 34 of the transformer 29 is resonated at the center frequency of the carrier wave band by a shunt-connected capacitor 35 and is provided with a substantially constant permeability core 36. Preferably the interstage coupling transformers 13 and 29 are substantially identical in all respects.

The secondary winding 34 of the coupling transformer 29 is coupled to the control grid 37 and cathode 38 of a second stage signal amplifying electronic tube 39 by means of a capacitor 41. The screen grid 42 and the suppressor grid 43 of this tube are connected respectively to a suitable source of positive potential and to the grounded cathode 38 in a conventional manner.

The anode 44 of the tube 39 is coupled through the primary winding 45 of a third interstage coupling transformer 46 to a suitable source of space current such as indicated at +B. The primary winding 45 is resonated by means of a capacitor 47 preferably at the lower frequency of the band of carrier wave frequencies to be amplified. Also, this winding is provided with a substantially constant permeability core 48. The secondary winding 49 of the transformer 46 is resonated by a shunt-connected capacitor 51 preferably at the higher frequency of the band of carrier wave frequencies to be amplified and is provided with a substantially constant permeability core 52.

The secondary winding 49 of the coupling transformer 46 is coupled by a capacitor 53 to the anode 54 and the cathode 55 of a carrier wave demodulating diode 56. A load resistor 57 connected between the grounded cathode 55 of the diode 56 and the low potential terminal of the secondary winding 49 of the coupling transformer 46 serves to develop unidirectional voltages constituting the intelligence signals which are modulated on the carrier waves amplified by means of the described signal amplifying system. A movable contact 58 provided on the load resistor 57 may be coupled to a suitable utilization circuit such as an audio frequency amplifier 59 which may be further conventionally coupled, as indicated, to suitable sound reproducing apparatus such as a loudspeaker (not shown).

By suitable design of the load circuit including the resistor 57 of the diode 56, there may be developed a unidirectional voltage which varies in magnitude in accordance with variations in the level of the signal modulated carrier waves for use as a gain controlling voltage for the signal amplifiers. Consequently, the high potential terminal of the load resistor 57 may be coupled to the gain controlling circuits of the signal amplifying system. As illustrated in the present embodiment of the invention, this terminal of the diode load resistor is connected by a resistor 61 to the low potential terminal of the secondary winding 34 of the tarnsformer 29 and thence to the control grid 37 of the tube 39. Similarly, this terminal of the diode load resistor is connected by resistors 61 and 62 to the low potential terminal of the secondary winding 17 of the coupling transformer 13 and thence to the control grid 21 of the tube 23. Likewise, this terminal of the diode load resistor is connected by resistors 61, 62 and 63 to similar gain controlling circuits of the signal input means 11.

Referring now to the operation of the variable band width signal amplifying system in accordance with the present invention, consideration first will be given to the particular manner in which the primary and secondary windings of the coupling transformers 13 and 29 function as a result of the respectively different core structures with which they are provided. In order to avoid duplication, particular reference will be made to the transformer 29, it being understood that the transformer 13 functions in an identical manner. The inductance of the primary winding 28 is a function of the permeability of the core 32. The permeability of the core, in turn, is a function of the magnetizing force to which it is subjected. Part of this magnetizing force is derived from the permanent magnet 33 and, therefore, is constant. The remainder of this magnetizing force is derived as a result of the current traversing the winding 28 and, therefore, is variable in accordance with variations of the anode current of the tube 23.

In accordance with the illustrative embodiment of the present invention, the constant magnetizing force produced by the magnet 33 is greater in magnitude and is of opposite polarity to the mgnetizing force produced by the winding 28. Therefore, when the magnetizing force produced by the primary winding is at a maximum as a result of maximum space current conduction in the tube 23, the effective magnetizing force to which the core 32 is subjected has a minimum value. In such a case, the inductance of the winding 28 has a minimum value. Under these conditions, the frequency at which the primary circuit of the transformer 29 is resonant has a maximum value. As the average space current in the tube 23 decreases in magnitude, the magnetizing force produced by the winding 28 also diminishes, thereby increasing the effective magnetizing flux to which the core 32 is subjected. The permeability of this core therefore increases to effect a corresponding increase in the inductance of the primary winding 28 whereby to effect resonance of the primary circuit at a somewhat lower frequency. Thus, it is seen that the resonant frequency of the primary circuit of the coupling transformer 29 is varied by effectively varying the inductance of the winding 28 and maintaining the capacitance of the capacitor 31 substantially constant.

Inasmuch as the core 36 of the secondary winding 34 of the transformer 29 has a substantially constant permeability irrespective of any variations in the signaling currents traversing the winding 34, the inductance of this winding remains substantially constant. However, since the grid-to-cathode circuit of the signal amplifying tube 39 is effectively coupled in parallel with the resonating capacitor 35, the average potential across this circuit determines the effective value of the resonating capacitance for the winding 34. It is well known that the magnitude of the negative potential impressed upon the control grid with respect to its associated cathode determines the grid-to-cathode capacitance of the tube. As a result of the impression upon the control grid of a minimum biasing voltage relative to the cathode, the grid-to-cathode capacitance has a maximum value. The total effective capacitance by means of which the winding 34 is resonated, therefore, has a maximum value and the frequency at which the secondary circuit of the transformer 29 is resonant, therefore, has a minimum value. As the magnitude of the grid biasing voltage increases, the grid-to-cathode capacitance of the tube 39 decreases, thereby effecting a corresponding increase in the frequency at which the secondary circuit of the transformer is resonant.

The automatic volume control voltage developed in the resistor 57 varies in magnitude directly with variations of the level of the signal modulated carrier waves. The impression of the automatic control voltage upon the control grid 21 of the tube 23 produces current variations in the primary winding 28 of the coupling transformer 29 which are inversely proportional to variations of the control voltage, as a result of which the resonant frequency of the primary circuit is decreased in response to an increase in the signal level. At the same time, the automatic volume control voltage derived from the resistor 57 is impressed as a negative grid biasing voltage upon the control grid 37 of the tube 39, as a result of which the frequency at which the secondary circuit of the transformer 29 is increased in response to increases in the signal level.

For a more detailed consideration of the operation of the present invention additional reference will be made to Figure 2. Assume in the first instance that a relatively weak signal is derived from the signal input means 11. As a result, there will be developed in the resistor 57 an automatic volume control voltage which has a minimum magnitude. The impression of this voltage upon the control grid 21 of the tube 23 effects a maximum space current conduction in the tube. Hence, the magnetizing force derived from the primary winding 28 of the transformer 29 has a maximum value so that, when opposed to the constant magnetizing force derived from the permanent magnet 33, there is produced a minimum net magnetizing force for the core 32. The permeability of this core, therefore, has a minimum value and consequently, the inductance of the winding 28 also has a minimum value so that the transformer primary circuit is tuned for resonance substantially at the center frequency of the band of carrier frequencies to be amplified.

At the same time, the impression of the minimum automatic volume control voltage derived from the resistor 57 upon the control grid 37 of the tube 39 produces a maximum value of capacitance between the control grid and its associated cathode 38. As a consequence, the secondary circuit of the transformer 29 also is tuned for resonance substantially at the center frequency of the band of carrier wave frequencies to be amplified. The overall response of this stage of the signal amplifying system is represented by the curve 64. Inasmuch as the automatic volume control voltage also is impressed upon the signal input means 11, it will be understood that the primary and secondary circuits of the transformer 13 also will be tuned for resonance substantially at the center frequency of the band of carrier wave frequencies to be amplified. Hence, the overall response characteristic of this stage of the amplifying system is substantially as represented by the curve 65 of Figure 2. The curve 66 represents the overall response characteristic of the signal amplifying stage including the transformer 46 which, in view of the conventional arrangement of the transformer, has a relatively flat topped, broad configuration covering substantially the entire band of carrier wave frequencies to be amplified.

Now assume that the level of the signal modulated carrier waves increases to a maximum. As a result, there is developed in the resistor 57 an automatic volume control voltage of maximum amplitude. The impression upon the control grid 21 of the tube 23 of this increased grid biasing voltage effects a decrease in the average magnitude of the space current in this tube. The magnetizing force developed by the primary winding 28 of the transformer 29 accordingly decreases so as to effect an increase in the net magnetizing force to which the core 32 is subjected. The permeability of this core, therefore, increases to effect a corresponding increase in the inductance of the winding 28. Inasmuch as the resonating capacity represented by the capacitor 31 is maintained substantially constant, it is seen that the frequency at which the primary circuit is resonant decreases from the center frequency of the band of carrier wave frequencies to be amplified. This effect is graphically represented by the curve 67 of Figure 2 in which the peak 68 represents the resonant frequency of the primary circuit of the transformer 29.

At the same time the impression of the increased negative automatic volume control voltage upon the control grid 37 of the tube 39 effects a decrease in the grid-to-cathode capacitance, principally by reason of the shifting of the space charge, or virtual cathode, to a position which is more remote from the grid. As a consequence, the effective resonating capacitance of the secondary winding 34 is decreased and, since the inductance of this winding remains substantially constant, it is seen that the secondary circuit of the transformer 29 is resonated at a higher frequency. This effect is represented by the peak 69 of the curve 67 of Figure 2. Similarly, the primary and secondary circuit resonant frequencies of the transformer 13 are represented respectively by the peaks 71 and 72 of the curve 73.

Inasmuch as the primary and secondary circuits of the coupling transformer 46 are not provided with the described facilities in accordance with the present invention, the response characteristic of this stage of the signal amplifying system does not change materially with changes in the level of the signal-modulated carrier waves. Accordingly, in response to strong signals the characteristic of this stage is represented by the curve 74 of Figure 2, which it may be seen, is substantially similar to the curve 66.

It may be seen from the curves of Figure 2 that the signal amplifying stages including the transformers 13 and 29 have relatively narrow pass bands and, therefore, high selectivity when low level signals are to be amplified. In the presence of high level signals, however, it is seen that the band widths of the amplifying stages including the transformers 13 and 29 are considerably increased. Consequently, when the sensitivity of the amplifying system is at a maximum for the amplification of weak signals, the fact that the band width of the system is relatively narrow prevents interference from stronger signals in channels adjacent to that of the weak signals. However, in the presence of strong signals where the sensitivity of the amplifying system is at a minimum, there is considerably less likelihood that signals in adjacent channels will cause interference. Consequently, the band width of the amplifying system is increased in order to realize maximum fidelity of reproduction.

It is to be particularly noted that, in the automatic variation of the band width of the amplifying system under the control of the signals to be amplified in accordance with the present invention, the center frequency to which the amplifying system is tuned remains substantially constant for signals of all levels. Consequently, there is eliminated distortions of the reproduced signals which would result from a shifting of the center frequency. It has been found that, with the proper selection of values for the resonating capacitors such as 31 and 35 employed respectively with primary and secondary windings 28 and 34 of the transformer 29, the opposite shifts of the frequency at which the primary and secondary circuits are resonant may be made substantially equal so as to maintain a relatively fixed center frequency for the amplifying system as a whole. In one practical case, it was found that this beneficial result could be obtained by using 22 micromicrofarad capacitors for the capacitors 14 and 31 and 15 micromicrofarad capacitors as the capacitors 18 and 35. In this case, it was determined that it was not only possible to effect substantially equal frequency shifts in the primary and secondary circuits, but also the shapes of the two portions of the curve such as 67 were substantially identical for all values of grid bias.

While the foregoing description of an illustrative embodiment of the invention has been given on the assumption that the particular material used for the variable permeability cores 15 and 32 have the characteristic of a permeability which varies inversely to the magnetizing force to which they are subjected, it will be appreciated by those skilled in the art that the underlying principles of the invention may be embodied in signal amplifying systems using other types of variable permeability cores which are well known. Not all cores possess the characteristic of a permeability which varies inversely to the magnetizing force therefore. This particular characteristic depends upon a number of factors, such as the materials of which the core is composed, the techniques employed in processing the cores during fabrication thereof and the past magnetic history thereof. A variable permeability magnetic core is known which has the characteristic of a permeability which varies directly with the magnetizing force to which it is subjected. When such a core is used in the amplifying system in place of either or both of the primary winding cores 15 and 32, no additional magnetic means is required to produce a component of magnetizing force. As the average current through the winding 38, for example, increases by virtue of the described automatic volume control voltage, the permeability of the core 32 decreases, thereby producing a smaller value of inductance of the winding 38 to produce a consequent increase in the frequency at which the primary winding is resonant. Alternatively, there may be used for either one or both of the variable permeability cores 15 and 32 one which has a permeability which generally decreases with an increase of the magnetizing force to which it is subjected, but which, prior to such a decrease, has a predetermined threshold value. In other words, magnetizing forces of relatively small magnitudes produce substantially no change in the permeability of the core until the magnetizing force has a predetermined magnitude. When using a core having such a characteristic, it may be desirable to employ an additional magnetic means, such as a permanent magnet to furnish a constant magnetizing force having a magnitude substantially equal to that required to bias the core at the threshold value. In such a case, however, it will be noted that the additional magnetic means is required to produce a magnetizing force of the same polarity as that of the magnetizing force derived from the transformer winding. It will be appreciated that variable permeability cores having any of the characteristics described may be used alternatively with the type of cores specifically described in conjunction with the illustrative embodiment of the invention without departing from the scope thereof.

It will be obvious to those skilled in the art that the present invention may be embodied in forms other than that specifically disclosed herein for illustrative purposes. Accordingly, the scope of the present invention is to be determined by reference to the appended claim.

What is claimed is:

In a variable band with amplifying system, a signal input means having controllable gain, said signal input means having input and output circuits and being tuned to receive a band of signal modulated carrier waves subject to signal level variations, a signal amplifying device having input and output electrodes, said input electrodes having variable capacitance effect therebetween, a transformer having a primary winding tuned to resonance connected across the output circuit of said signal input means and a secondary winding tuned to resonance connected between said input electrodes, said primary and secondary windings being tuned substantially to the center frequency of said carrier-wave band, variable permeability core means for said primary winding, said core means comprising a variable permeability core element and a permanent magnet polarized and movably positioned to subject said variable permeability core element to a substantially constant magnetizing force in opposition to the magnetizing force from current in said primary winding, a substantially constant permeability core element for said secondary winding, a source of automatic gain control potentials, circuit means for applying an increased gain control potential to said signal input means to thereby effect decrease in signal current in said primary winding, said decrease in signal current increasing the permeability of said variable permeability core means to lower the resonant frequency of said primary winding, circuit means for connecting said gain control potential between said input electrodes of said amplifying device, said control potential decreasing the capacitance effect between said input electrodes to raise the resonant frequency of said secondary winding, said changes in resonant frequency in said primary and secondary windings being substantially equal as well as opposite, whereby the center frequency of the band to which the system is tuned remains substantially constant with said frequency changes, a utilization circuit and circuit means for connecting said output electrode of said amplifying device to said utilization circuit.

ROBERT L. HARVEY.

References Cited in the file of this patent

UNITED STATES PATENTS

| Number | Name | Date |
|---|---|---|
| 2,185,879 | Allen | Jan. 2, 1940 |
| 2,245,340 | Harvey | June 10, 1941 |
| 2,342,492 | Rankin | Feb. 22, 1944 |
| 2,503,155 | Harvey et al. | Apr. 4, 1950 |
| 2,517,741 | Varone | Aug. 8, 1950 |